United States Patent
Iino

(10) Patent No.: US 7,491,908 B2
(45) Date of Patent: Feb. 17, 2009

(54) PLASMA PROCESSING DEVICE AND ASHING METHOD

(75) Inventor: Yoshinori Iino, Kanagawa (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 31 days.

(21) Appl. No.: 10/567,665

(22) PCT Filed: Aug. 6, 2004

(86) PCT No.: PCT/JP2004/011657

§ 371 (c)(1),
(2), (4) Date: Aug. 31, 2006

(87) PCT Pub. No.: WO2005/015628

PCT Pub. Date: Feb. 17, 2005

(65) Prior Publication Data
US 2007/0151956 A1    Jul. 5, 2007

(30) Foreign Application Priority Data
Aug. 12, 2003  (JP) .............................. 2003-207379

(51) Int. Cl.
*B23K 10/00* (2006.01)
(52) U.S. Cl. .............................. 219/121.43; 219/121.4; 219/121.44; 118/723 MW; 204/298.38; 156/345.37
(58) Field of Classification Search ............ 219/121.43, 219/121.4, 121.41, 121.59, 121.44; 118/723 MW; 204/298.38; 156/345.37
See application file for complete search history.

(56) References Cited
U.S. PATENT DOCUMENTS
5,441,568 A     8/1995  Cho et al.

| | | | |
|---|---|---|---|
| 5,866,986 A * | 2/1999 | Pennington | 315/111.21 |
| 6,217,703 B1 | 4/2001 | Kitagawa | |
| 6,383,301 B1 * | 5/2002 | Bell et al. | 118/716 |
| 2002/0039625 A1 * | 4/2002 | Powell et al. | 427/569 |
| 2005/0158884 A1 * | 7/2005 | Gaynor | 438/4 |

FOREIGN PATENT DOCUMENTS

| | | |
|---|---|---|
| JP | 09-045495 | 2/1997 |
| JP | 10-298787 | 11/1998 |
| JP | 11-045873 | 2/1999 |
| JP | 2000-183040 | 6/2000 |
| JP | 2001-110775 | 4/2001 |
| JP | 2001-115267 | 4/2001 |
| JP | 2002-075961 | 3/2002 |
| TW | 406522 | 9/2000 |

* cited by examiner

*Primary Examiner*—Mark H Paschall
(74) *Attorney, Agent, or Firm*—Oblon, Spivak, McClelland, Maier & Neustadt, P.C.

(57) ABSTRACT

A plasma processing device comprises a chamber capable of maintaining an atmosphere depressurized less than atmospheric pressure, a transfer pipe connected to the chamber, a gas introduction mechanism for introducing a gas into the transfer pipe, and a microwave supply source for introducing a microwave from outside to inside of the transfer pipe. The plasma processing device can form a plasma of the gas in the transfer pipe and perform plasma processing on a workpiece placed in the chamber. The transfer pipe is connected to have an opening in an inner wall of the chamber, the inner wall being generally perpendicular to a major surface of the workpiece. The workpiece is not provided on direct line of sight from the plasma.

9 Claims, 21 Drawing Sheets

PLASMA PROCESSING DEVICE AND ASHING METHOD

TECHNICAL FIELD

This invention relates to a plasma processing device and an ashing method, and more particularly to a plasma processing device and an ashing method capable of rapidly removing resist while reducing damage to a workpiece.

BACKGROUND ART

Plasma processing such as plasma-based ashing, dry etching, thin film deposition, or surface modification is applied to semiconductor manufacturing devices and liquid crystal display manufacturing devices, and widely used in various industrial fields including the electronics industry.

In particular, the "ashing process" for ashing resist using a plasma is often used as a dry process for removing and decomposing the resist used as a mask material in etching or ion implantation for fine patterning.

As a plasma processing device that can be used in such an ashing process, the so-called "down flow type" and "remote plasma type" devices are known.

In the "down flow type" plasma processing device, a generation chamber for generating a plasma and a reaction chamber in which a workpiece is mounted are provided in the same vacuum chamber (see, e.g., JP 5-315292A (1993)). On the other hand, in the "remote plasma type" plasma processing device, a generation chamber for generating a plasma is connected via a transfer pipe to a reaction chamber in which a workpiece is mounted, and thus the device is configured so that the plasma is isolated from the workpiece (see, e.g., JP 2001-189305A and JP 2002-541672T).

FIG. 20 is a schematic view showing an example "down flow type" ashing device. This device has a chamber 110, a transmission window 118 made of a planar dielectric plate provided on the upper face of the chamber 110, a microwave waveguide 120 provided outside the transmission window 118, and a stage 116 for mounting and holding a workpiece W such as a semiconductor wafer in the processing space below the transmission window 118.

This ashing device is used to ash the surface of the workpiece W as follows. The processing space is first depressurized by an evacuation system E. An atmosphere of a processing gas is then formed, where a microwave M is fed from the microwave waveguide 120. The microwave M provides energy to the gas in the chamber 110 via the transmission window 118 and forms a plasma P of the processing gas. In the plasma P, ions and electrons collide with molecules of the processing gas to generate excited active species (plasma products) such as excited atoms, molecules, and free atoms (radicals). These plasma products diffuse in the processing space as represented by arrow A and fly to the surface of the workpiece W, where plasma processing such as etching occurs.

The publication JP 5-315292A discloses a down flow type ashing device of the type described above, where a shower head 400 with a plurality of holes formed therein is provided between the generation chamber for generating a plasma and the reaction chamber in which the workpiece W is mounted. The purpose of this shower head 400 is to allow passage of active particle species of the plasma and to prevent passage of ions.

FIG. 21 is a schematic view showing the relevant part of a "remote plasma type" plasma processing device disclosed in JP 2001-189305A. More specifically, a plasma transfer pipe 130 is connected above a chamber 110. A processing gas G is supplied through the tip of the plasma transfer pipe 130, to which a microwave waveguide 120 is connected and a microwave M is supplied. The microwave M provides energy to the processing gas G to form a plasma P. Active species A such as radicals contained in the plasma P are supplied via the transfer pipe 130 to a workpiece W in the chamber 110, where plasma processing such as ashing thereby occurs.

The publication JP 2002-541672T discloses a plasma generating device in which a transfer pipe 130 includes a right-angle "bend" to avoid direct line of sight extending from glow discharge of plasma P to a downstream chamber 110.

In recent years, an insulation film made of a "low-k material" (a material having a low dielectric constant) has received attention as a constituent technology for achieving higher integration of semiconductor devices. This is a material for use in interlayer insulating films provided between a plurality of interconnect layers or in gate insulating films for insulated gate devices, and has an advantage in its capability of reducing parasite capacitance because of its low dielectric constant. These low-k materials may include, for example, organic materials such as polyimides, and porous silicon oxides.

However, the inventors have recognized as a result of their independent experiments that the workpiece subjected to plasma processing by these conventional devices may be damaged, or otherwise there is room for improvement in the efficiency of plasma processing. More specifically, it is recognized that, when such a low-k material is patterned with a resist mask formed thereon and the resist mask is subsequently ashed, the low-k material is also etched, which has a problem of increasing the dielectric constant and/or parasite capacitance.

The invention is based on the recognition of these problems. An object of the invention is to provide a plasma processing device and an ashing method capable of ashing or other plasma processing for low-k materials and the like without unnecessary damage thereto on the basis of ideas different from conventional technologies.

DISCLOSURE OF INVENTION

To achieve the above object, a first plasma processing device of the invention comprises a chamber capable of maintaining an atmosphere depressurized less than atmospheric pressure; a transfer pipe connected to the chamber; a gas introduction mechanism for introducing a gas into the transfer pipe; and a microwave supply source for introducing a microwave from outside to inside of the transfer pipe, the plasma processing device being capable of forming a plasma of the gas in the transfer pipe and performing plasma processing on a workpiece placed in the chamber, wherein the transfer pipe is connected to have an opening in an inner wall of the chamber, the inner wall being generally perpendicular to a major surface of the workpiece, and the workpiece is not provided on direct line of sight from the plasma.

According to the above configuration, in a remote plasma type plasma processing device, reliable plasma processing can be performed while avoiding damage to the workpiece caused by light emitted from the plasma.

Here, the transfer pipe may be connected to the inner wall of the chamber with a tilt such that its axis line is directed away from the workpiece as compared to when the transfer pipe is connected generally perpendicular to the inner wall of the chamber. In this case, light emitted from the plasma can be directed away from the workpiece more reliably.

A second plasma processing device of the invention comprises a chamber capable of maintaining an atmosphere depressurized less than atmospheric pressure; a transfer pipe connected to the chamber via a generally L-shaped connection pipe; a gas introduction mechanism for introducing a gas into the transfer pipe; and a microwave supply source for introducing a microwave from outside to inside of the transfer pipe, the plasma processing device being capable of forming a plasma of the gas in the transfer pipe and performing plasma processing on a workpiece placed in the chamber, wherein the connection pipe is connected to have an opening in an inner wall of the chamber, the inner wall being generally opposed to a major surface of the workpiece, and the connection pipe has an inner wall made of a fluorine-containing resin.

According to the above configuration, in a remote plasma type plasma processing device, reliable plasma processing can be performed while avoiding damage to the workpiece caused by light emitted from the plasma.

Here, a light shield for blocking light emitted from the plasma and for allowing passage of active species emitted from the plasma may be provided between the plasma and the workpiece. In this case, light emitted from the plasma can be blocked from the workpiece more reliably.

A third plasma processing device of the invention comprises a chamber capable of maintaining an atmosphere depressurized less than atmospheric pressure; a transmission window occupying part of a wall of the chamber; a microwave supply source for introducing a microwave from outside to inside of the chamber via the transmission window; and a gas introduction mechanism for introducing a gas into the chamber, the plasma processing device being capable of forming a plasma of the gas in the chamber and performing plasma processing on a workpiece placed in the chamber, wherein a light shield for blocking light emitted from the plasma and for allowing passage of active species emitted from the plasma is provided between the plasma and the workpiece.

According to the above configuration, in a down flow type plasma processing device, reliable plasma processing can be performed while avoiding damage to the workpiece caused by light emitted from the plasma.

Here, rectifying means for regulating distribution of gas flow on the workpiece may be provided, the gas flow being supplied from the transfer pipe. In this case, uniformity of plasma processing on the workpiece can be improved.

Furthermore, an absorber for absorbing light emitted from the plasma may be provided on at least one of the inner wall of the chamber and an inner wall of the transfer pipe. In this case, light emitted from the plasma can be blocked from the workpiece more reliably.

The ashing method of the invention is an ashing method for removing a resist of a workpiece having an insulating layer on which the resist is formed, comprising forming a plasma containing hydrogen and an inert gas; allowing active species emitted from the plasma to act on the workpiece placed in a chamber capable of maintaining an atmosphere depressurized less than atmospheric pressure; and removing the resist in a condition that the workpiece is not substantially irradiated with light emitted from the plasma.

According to the above configuration, reliable ashing can be performed while avoiding damage to the workpiece caused by light emitted from the plasma.

Here, the inert gas may be helium. In this case, alteration of the insulating layer can be prevented.

Furthermore, the insulating layer may comprise a low-k material. In this case, reliable ashing can be performed while preventing decrease of the film thickness and alteration of the insulating layer.

BEST MODE FOR CARRYING OUT THE INVENTION

Embodiments of the invention will now be described in detail with reference to examples.

Figure 1:
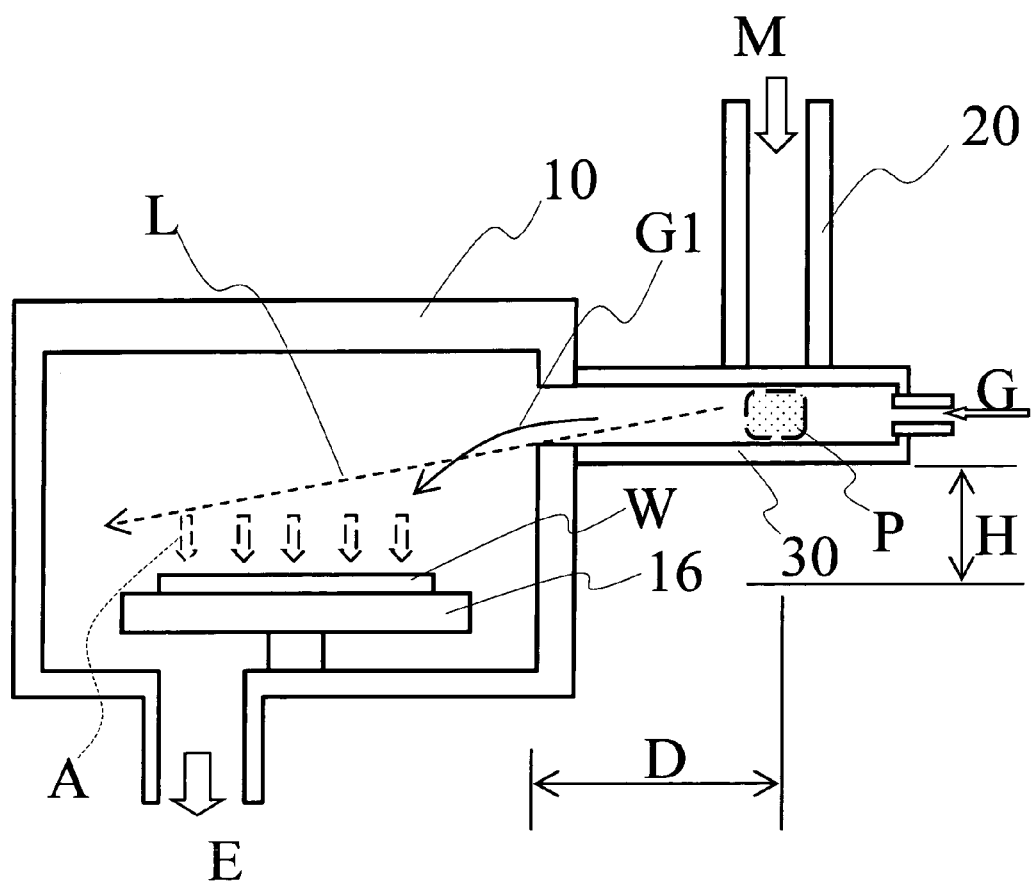
FIG. 1 is a conceptual view for illustrating a plasma processing device and an ashing method according to an embodiment of the invention.

FIG. 1 is a conceptual view for illustrating a plasma processing device and an ashing method according to an embodiment of the invention.

More specifically, the plasma processing device of this example is also a "remote plasma type" device, and includes a chamber 10, a transfer pipe 30 provided on a side face of the chamber 10, and a waveguide 20 for supplying a microwave M to the transfer pipe 30.

The chamber 10 can maintain a depressurized atmosphere formed by an evacuation system E. A stage 16 for mounting and holding a workpiece W such as a semiconductor wafer is provided in the vicinity of the center of the chamber 10.

In this example, the workpiece W is not placed on the direct line of sight from plasma P. That is, the arrangement of various elements is determined so that the workpiece W is not irradiated with light L emitted from the plasma P. More specifically, in the case that the transfer pipe 30 is connected to the side face of the chamber 10, the height H from the workpiece W to the transfer pipe 30 and the distance D from the chamber inner wall to the generating location of the plasma P can be specified as appropriate to prevent the workpiece W from being irradiated with light emitted from the plasma P. As a result, any damage to the workpiece W caused by light from the plasma P can be prevented to perform highly efficient plasma processing.

This example has a further advantage in its low "deactivation" of active species such as radicals generated by the plasma P. More specifically, active species contained in the plasma P are supplied to the surface of the workpiece W along gas flow G1. Here, the transfer pipe 30 has no "bend" or the like, which reduces the possibility that active species collide with the pipe wall or the like to be deactivated by recombination. That is, deactivation of active species can be minimized to allow rapid plasma processing.

Next, the experimental result of ashing by the plasma processing device of this embodiment is described.

low-k material by preventing irradiation with light from the plasma P and by using a unique etching gas.

The inventors investigated the etching and alteration of an insulating layer made of low-k material by forming a plasma P in a condition similar to that for ashing and placing the insulating layer in a chamber without applying the resist 300 thereto. The low-k material used is a porous Si—O—C—H compound having a structural formula as follows:

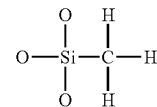

Figure 21:
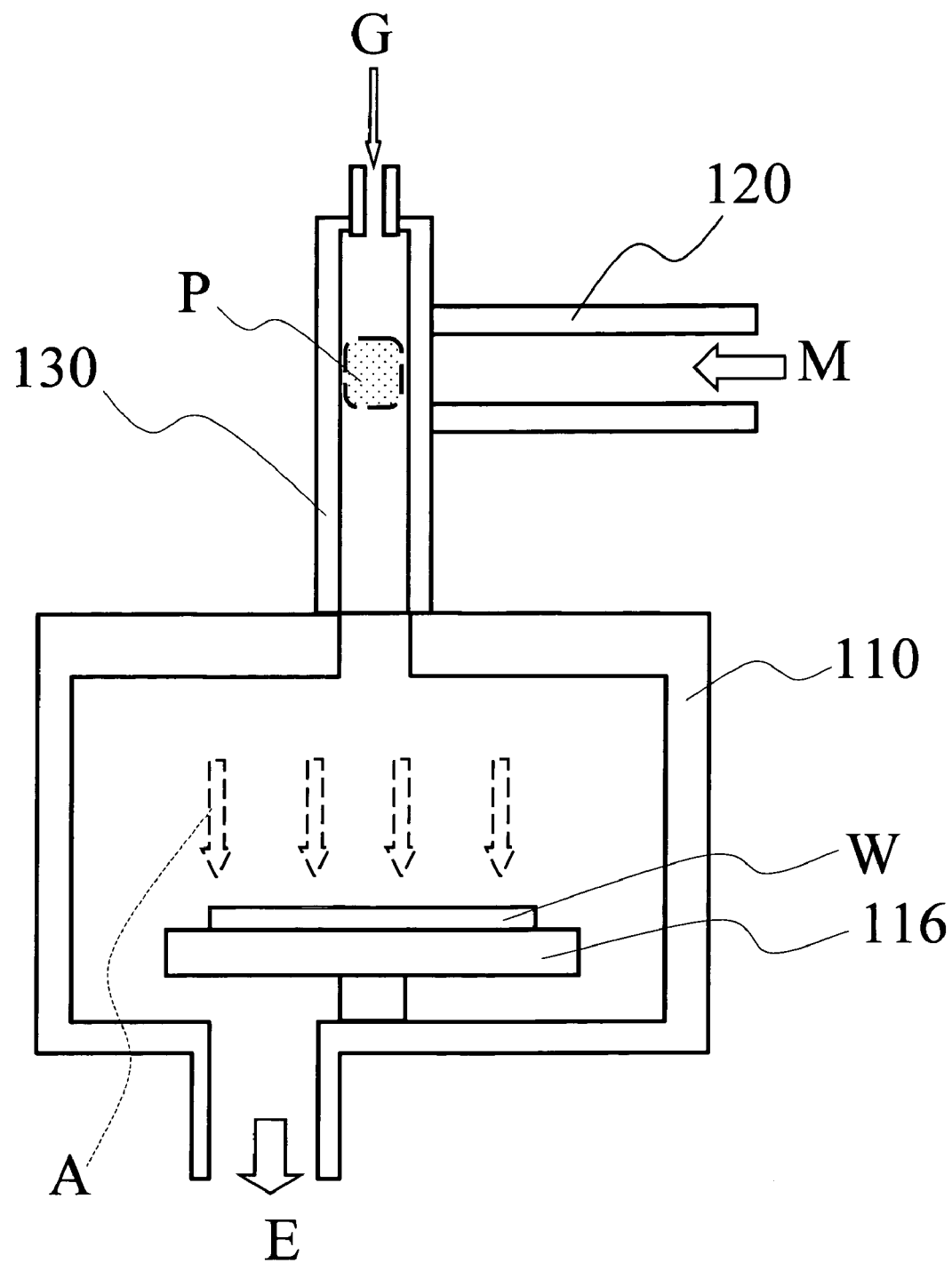
FIG. 21 is a schematic view showing the relevant part of a "remote plasma type" plasma processing device.

As a comparative example, the inventors also performed an experiment using a remote plasma type plasma processing device as shown in FIG. 21 in which a workpiece W is directly irradiated with light from the plasma P. The ashing condition is as follows:

| SAMPLE NO. | INERT GAS | | ASHING GAS | | | PRESSURE [Pa] | MICRO-WAVE POWER[W] | TEMPERA-TURE [°C.] | PLASMA PROCESSING TIME | PROCESSING DEVICE |
|---|---|---|---|---|---|---|---|---|---|---|
| | He [sccm] | Ar [sccm] | $H_2$ [sccm] | $N_2$ [sccm] | $O_2$ [sccm] | | | | | |
| 1 | 4750 | | 250 | | | 133 | 2000 | 200 | EQUIVALENT TO 500 nm | THIS INVENTION |
| 2 | 4750 | | 250 | | | 133 | 2000 | 200 | EQUIVALENT TO 500 nm | COMPARATIVE EXAMPLE |
| 3 | | 4750 | 250 | | | 133 | 2000 | 200 | EQUIVALENT TO 500 nm | THIS INVENTION |
| 4 | 4750 | | | 250 | | 133 | 2000 | 200 | EQUIVALENT TO 500 nm | THIS INVENTION |
| 5 | 4750 | | | | 250 | 133 | 2000 | 200 | EQUIVALENT TO 500 nm | THIS INVENTION |

Figure 2:
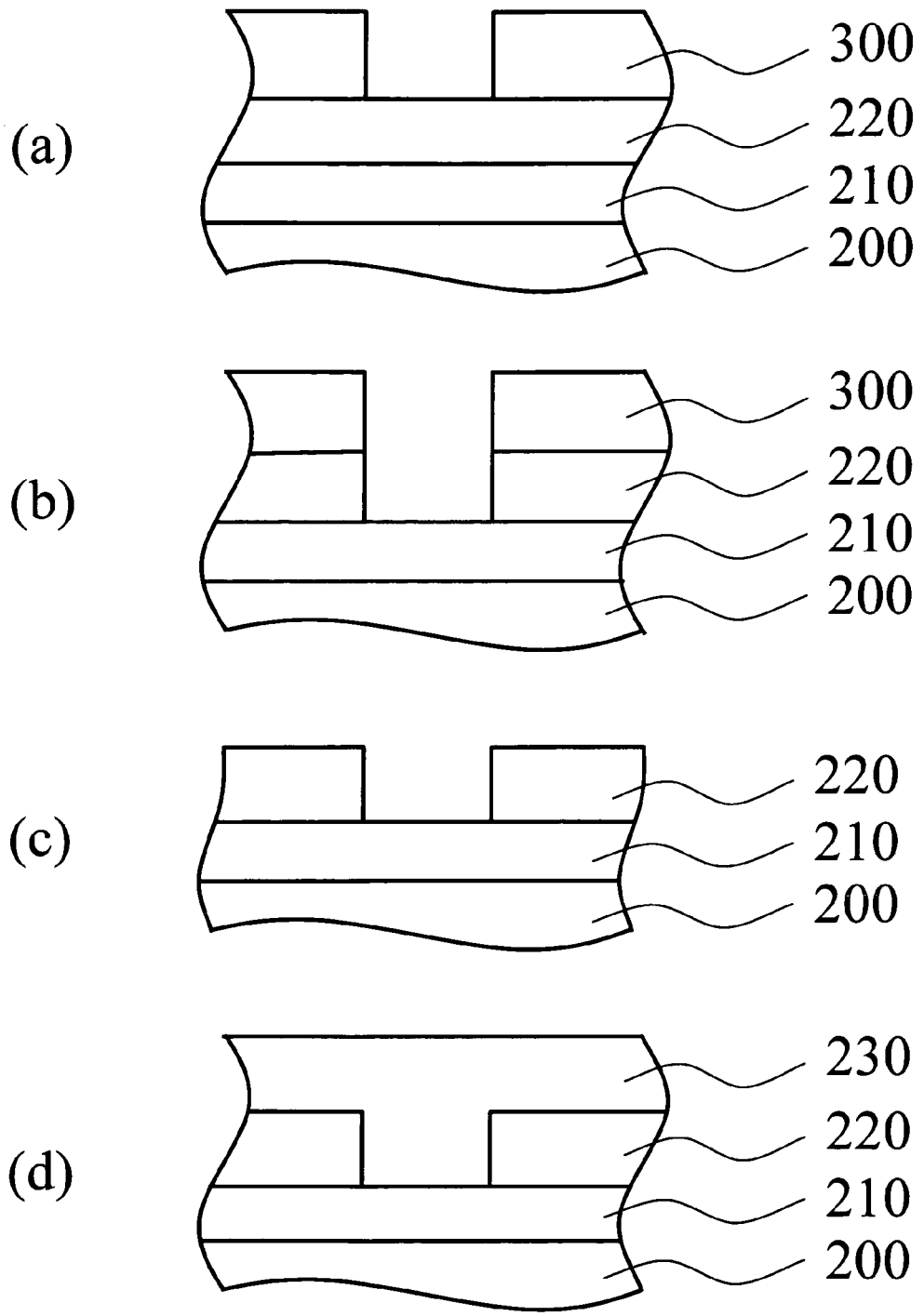
FIG. 2 is a process cross section for illustrating the experiment performed by the inventors.

FIG. 2 is a process cross section for illustrating the experiment performed by the inventors. More specifically, this figure is a process cross section showing part of a process of manufacturing a semiconductor device having copper (Cu) interconnect layers.

First, as shown in FIG. 2(a), on a semiconductor layer 200 are laminated a lower interconnect layer 210 made of copper and an interlayer insulating layer 220, on which a resist 300n is formed in a predetermined pattern.

Next, as shown in FIG. 2(b), the resist 300 is used as a mask, and in its opening the interlayer insulating layer 220 is etched to form a via hole.

Next, as shown in FIG. 2(c), the resist 300 is removed by ashing, and as shown in FIG. 2(d), an upper interconnect layer 230 is formed, which yields a multilayer interconnect structure.

It is important here to decrease the dielectric constant of the interlayer insulating layer 220 in order to reduce the parasite capacitance between the lower interconnect layer 210 and the upper interconnect layer 230. To this end, a "low-k material" must be used. However, when a conventional ashing device is used in this situation, the step of ashing the resist 300 as shown in FIG. 2(c) may involve etching and/or alteration of the underlying interlayer insulating layer 220.

In contrast, as illustrated in FIG. 1, this embodiment enables rapid ashing of the resist 300 while avoiding etching and/or alteration of the interlayer insulating layer 220 of More specifically, the ashing gas was $H_2$ (hydrogen) for Samples 1 to 3, $N_2$ (nitrogen) for Sample 4, and $O_2$ (oxygen) for Sample 5. The inert carrier gas was He (helium) for Samples 1, 2, 4, and 5, and Ar (argon) for Sample 3.

Sample 2 was subjected to plasma processing by an ashing device as shown in FIG. 21 in which a workpiece W is directly irradiated with light from plasma P. The other samples were subjected to plasma processing by a plasma processing device as shown in FIG. 1 in which a workpiece W is not irradiated with light from plasma P. The processing time for each sample is set to a period of time in which a resist having a thickness of 500 nanometers can be removed by ashing.

The etching amount for each sample subjected to plasma processing as described above was measured. Furthermore, the surface of the interlayer insulating layer after plasma processing was evaluated by spectral ellipsometry to measure the thickness of the altered layer.

Figure 3:
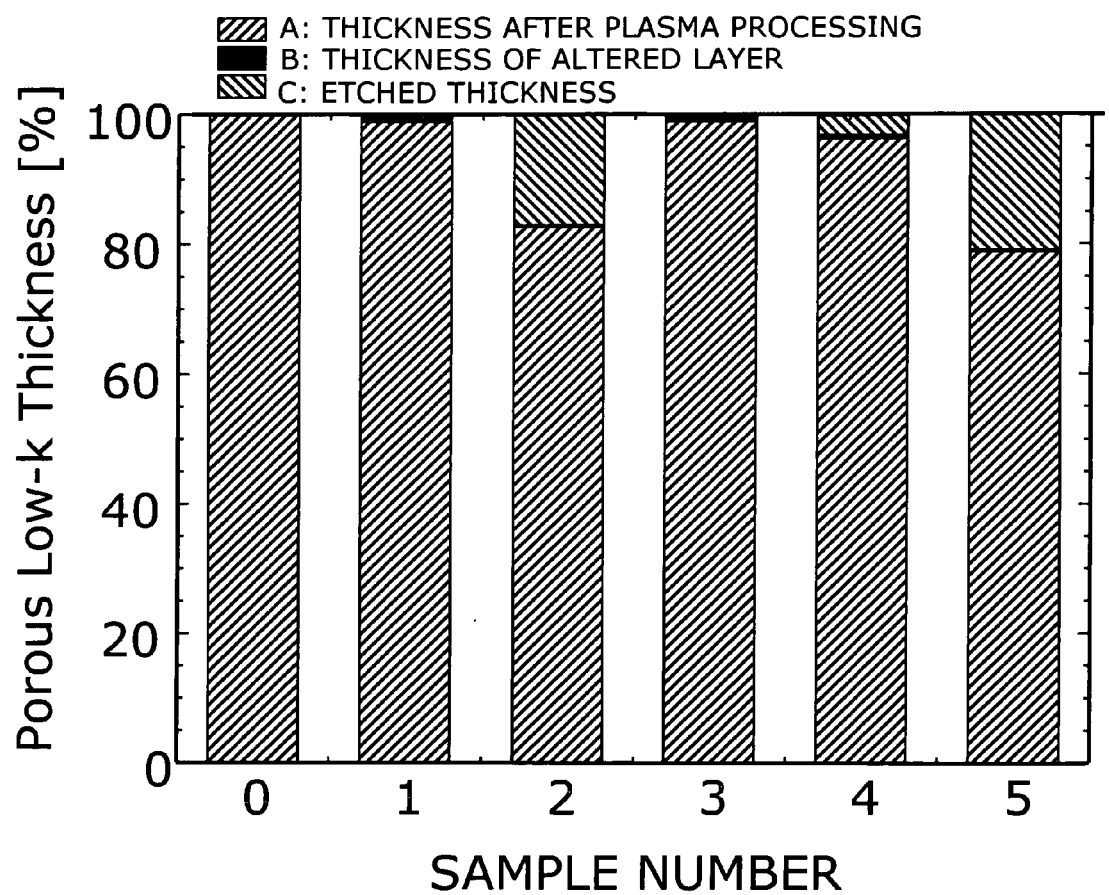
FIG. 3 is a graphical diagram summarizing the experimental result for a set of samples.

FIG. 3 is a graphical diagram summarizing the experimental result for a set of samples. More specifically, the horizontal axis of this figure represents the sample number, where "0" denotes the thickness of the interlayer insulating layer not subjected to plasma processing. The vertical axis of this figure represents, for each sample, the thickness A after plasma processing, the thickness B of the altered layer formed on the surface, and the etched thickness C.

Sample 1 can be compared with sample 2 to find the following. When the plasma processing device of the comparative example is used (sample 2), the etching amount for the interlayer insulating layer reaches nearly 18 percent of the initial thickness. However, when the plasma processing device of the invention is used (sample 1), the etching amount is reduced to a few percent or less. As can be seen from the cross-sectional structure shown in FIG. 2, a thinned interlayer insulating layer 220 may cause a problem of increasing the parasite capacitance between the upper and lower electrodes. In this respect, the plasma processing device of the invention can minimize the decrease of the thickness of the interlayer insulating layer 220, that is, the increase of parasite capacitance.

Accordingly, the interlayer insulating layer of low-k material is etched by the conventional ashing device presumably because light emitted from plasma P accelerates decomposition of the low-k material.

Figure 4:
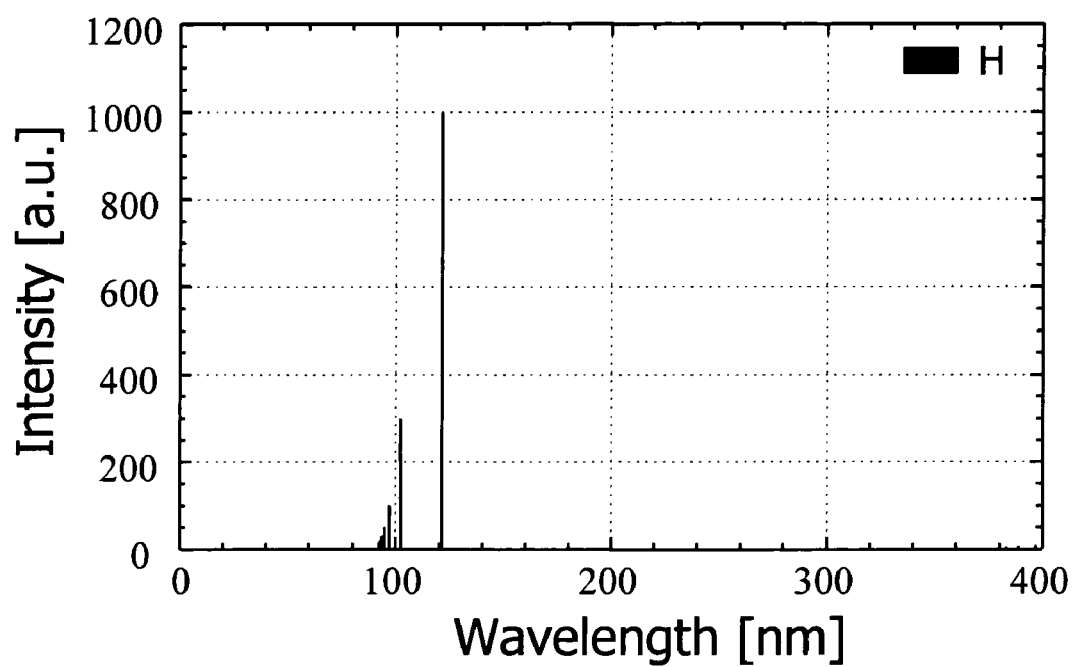
FIG. 4 is a graphical diagram showing an emission spectrum of $H_2$ (hydrogen)
Figure 5:
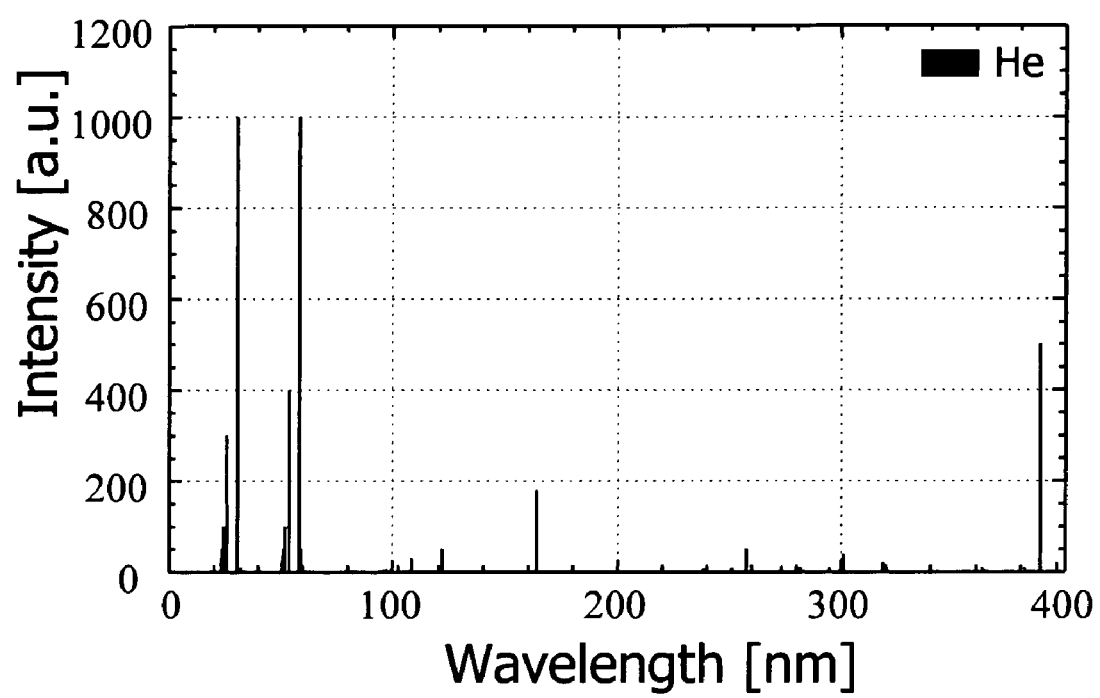
FIG. 5 is a graphical diagram showing an emission spectrum of He (helium)

FIGS. 4 and 5 are graphical diagrams showing an emission spectrum of $H_2$ (hydrogen) and He (helium), respectively. As can be seen from these figures, a plasma P of $H_2$ and He emits ultraviolet radiation (UV light) having wavelengths of about 100 nanometers or less. Such ultraviolet radiation presumably serves to decouple interatomic bonding in low-k materials such as organic materials or porous silicon oxides doped with carbon or the like. It is therefore contemplated that irradiation of a low-k material with such ultraviolet radiation may destabilize bonding between its constituent atoms and accelerate their dissociation from the matrix because of the presence of hydrogen (H) radicals.

In contrast, as illustrated in FIG. 1, the invention achieves an arrangement in which the workpiece W is not irradiated with light from plasma P. This results in suppression of etching of the insulating layer due to its irradiation with light including ultraviolet radiation, and can thereby prevent the film thickness from decreasing.

Returning to FIG. 3, the effect of different gas species is described. Comparing sample 1 with sample 3, it is recognized that, while the etching amount of low-k material is a few percent or less in both cases, the thickness B of the altered layer on the surface tends to increase slightly when argon (Ar) is used as an inert carrier gas (sample 3). Furthermore, by visual observation, while no change is recognized on the surface of sample 1, it is recognized that the surface of sample 3 is discolored brown. Since the dielectric constant tends to increase by the formation of such an altered layer, helium is more desirable than argon for the inert carrier gas.

On the other hand, comparison of sample 1 with samples 4 and 5 reveals that the etching amount of low-k material is about 5 percent when $N_2$ (nitrogen) is used as an ashing gas (sample 4), while the etching amount reaches as high as about 20 percent when $O_2$ (oxygen) is used as an ashing gas (sample 5). Such decrease of the film thickness will cause the increase of parasite capacitance. That is, it is more desirable to use $H_2$ (hydrogen) than to use $N_2$ (nitrogen) or $O_2$ (oxygen) for the ashing gas.

Figure 6:
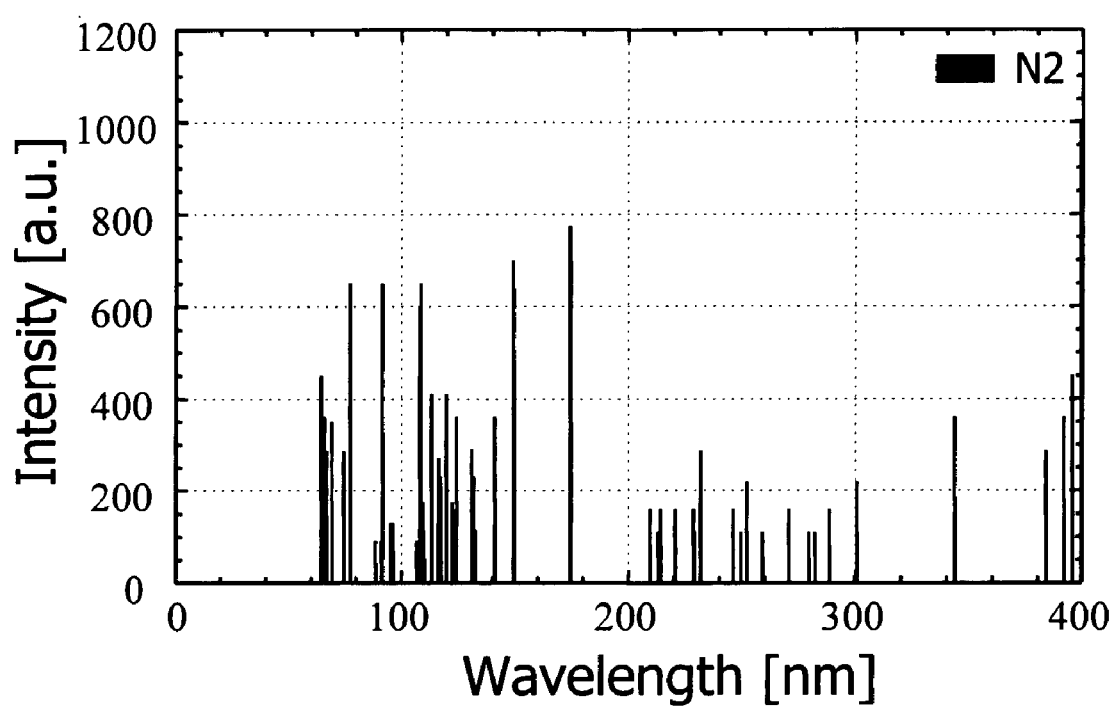
FIG. 6 is a graphical diagram showing an emission spectrum of $N_2$.
Figure 7:
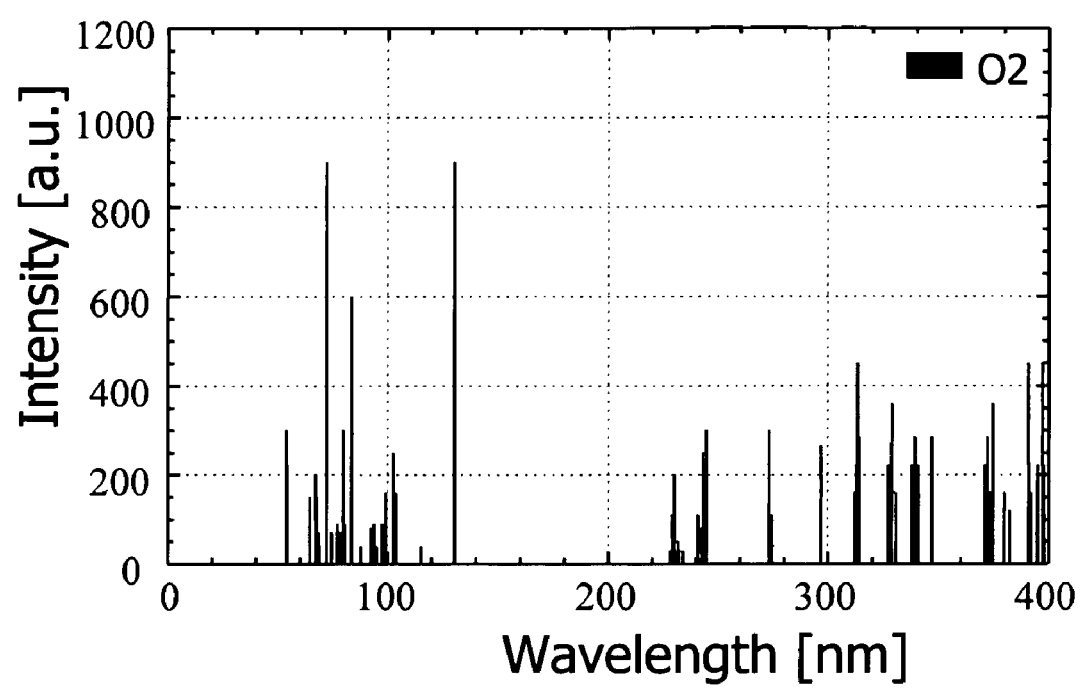
FIG. 7 is a graphical diagram showing an emission spectrum of $O_2$.

FIGS. 6 and 7 are graphical diagrams showing an emission spectrum of $N_2$ and $O_2$, respectively. As can be seen from comparison of these graphs with FIG. 4, the number and intensity of emission spectral lines, and hence the emission intensity, in the ultraviolet wavelength region are higher for $N_2$ and $O_2$ than for $H_2$ serving as an ashing gas. Therefore, when light from plasma P is not completely blocked, the effect of accelerating etching of low-k material due to ultraviolet radiation is more likely to occur.

Figure 8:
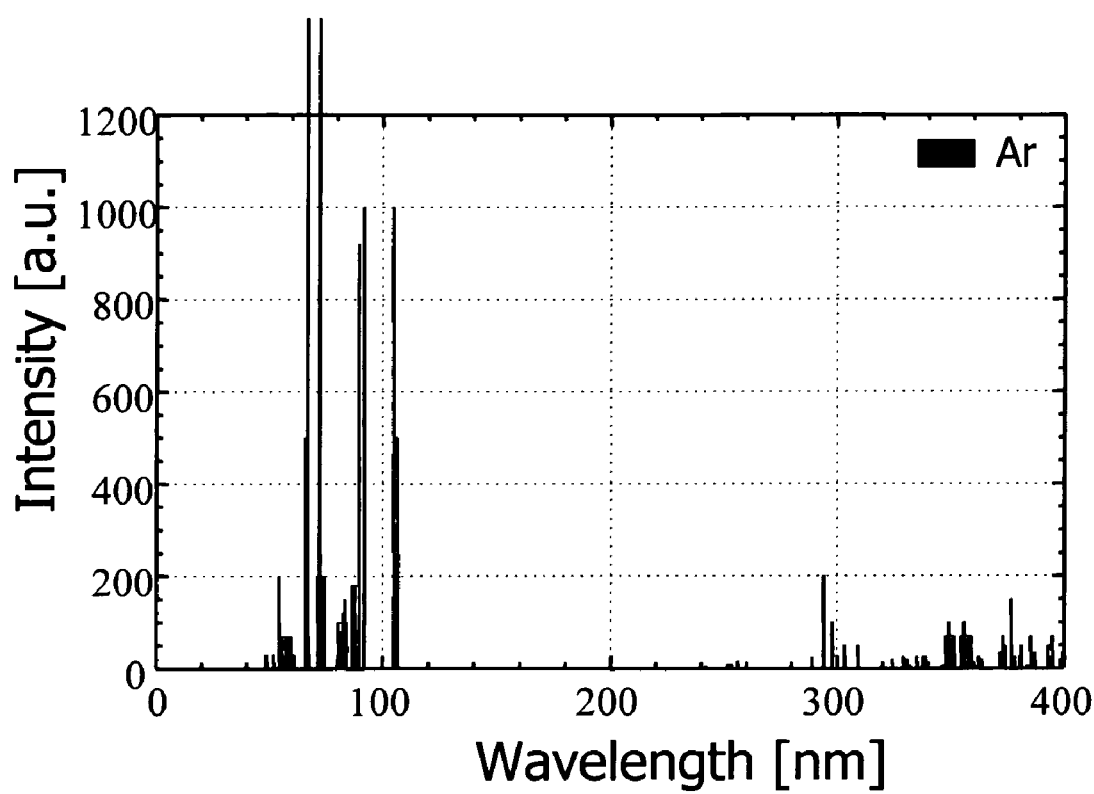
FIG. 8 is a graphical diagram showing an emission spectrum of Ar (argon)

FIG. 8 is a graphical diagram showing an emission spectrum of Ar (argon). It is found by comparison with FIG. 5 that the amount of emission in the wavelength region of ultraviolet radiation is greater for Ar than for He (helium). Therefore in this case again, when light from plasma P is not completely blocked, the effect of accelerating etching of low-k material due to ultraviolet radiation is more likely to occur. Therefore, when light from plasma P is not completely blocked, the effect of accelerating etching of low-k material due to ultraviolet radiation is more likely to occur.

To give a summary of the plasma processing device and ashing method of this embodiment described above, it is preferred to use a plasma processing device having an arrangement in which the workpiece W is not irradiated with light from plasma P. Specific configurations for this, in addition to that illustrated in FIG. 1, are described later in further detail with reference to various examples.

On the other hand, for an ashing gas, it is more desirable to use $H_2$ than to use $N_2$ or $O_2$. For an inert carrier gas, it is more desirable to use He than to use Ar.

Not only for the specific low-k materials described above can the invention achieve similar advantageous effects for various other low-k materials. Low-k materials to which the invention is applicable are those for use especially in gate insulating films or interlayer insulating films of a semiconductor integrated circuit and having a dielectric constant of 3.5 or less. Typical examples include polyimides, benzocyclobutene, parylene, fluorocarbons, carbon-containing silicon oxides, and porous bodies thereof.

Resists that can be ashed are those sensitive to exposure light sources such as the g-line, i-line, 157-nanometer wavelength, and 193-nanometer wavelength that are frequently used, for example, in semiconductor manufacturing processes. Such resists may include, for example, those containing novolac, polyvinylphenols, acrylates, cycloolefins, or the like.

Low-k materials and resists are not limited to the examples described above, but it is possible to employ any of those that can be appropriately selected and used by those skilled in the art.

Next, a variation of the plasma processing device of the invention is described.

Figure 9:
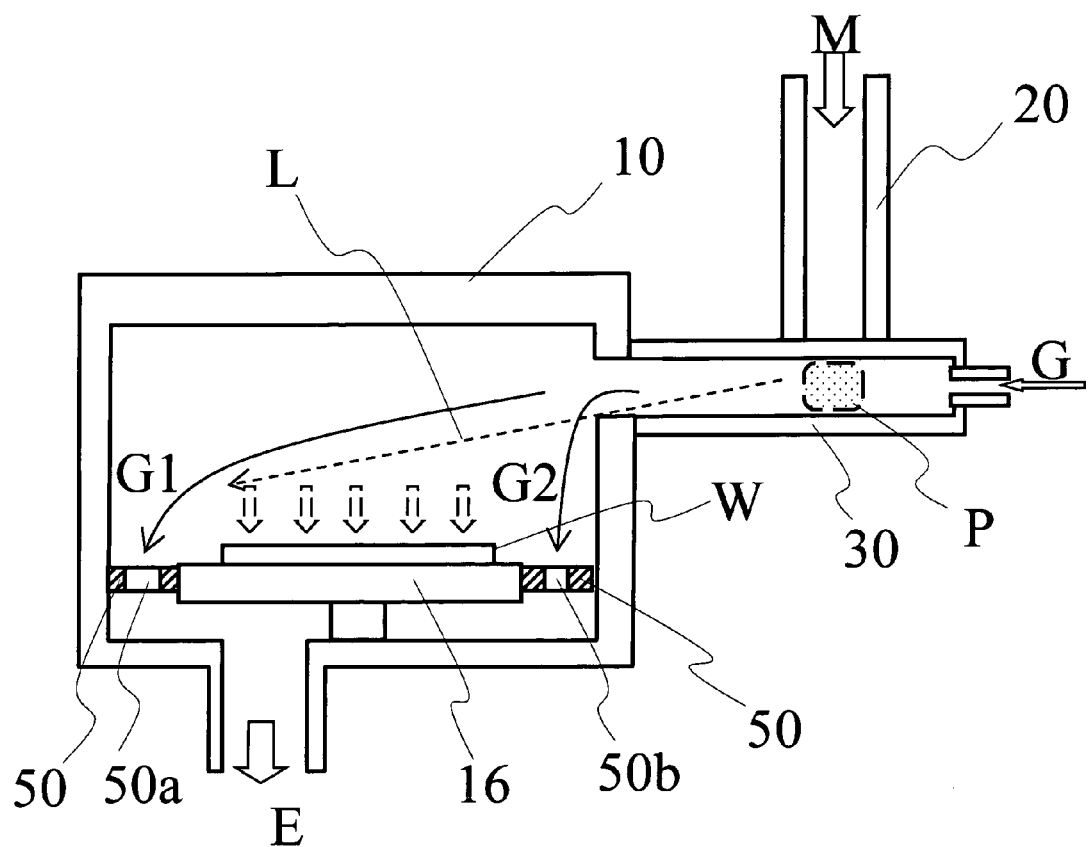
FIG. 9 is a schematic view showing a second example of the plasma processing device of the invention.

FIG. 9 is a schematic view showing a second example of the plasma processing device of the invention. Regarding this figure, components similar to those described above with reference to FIGS. 1 to 8 are marked with like reference numerals and not described in detail.

In this example, a rectifier 50 is provided around the stage 16. The rectifier 50 serves to regulate the flow of processing gas G. More specifically, in the case that a transfer pipe 30 is connected to the side face of the chamber 10 to prevent the workpiece W from being irradiated with emission from plasma P, gas flow running toward the evacuation means E becomes asymmetric as viewed from the workpiece W. For this reason, the rate of plasma processing such as ashing or etching on the workpiece W may have a biased in-plane distribution and become nonuniform. In contrast, in this example, a rectifier 50 is provided around the stage 16 to allow for correcting nonuniformity on the surface of the workpiece W. Specifically, for example, openings 50a and 50b are provided in the rectifier 50 so that the opening 50a on the side farther from the transfer pipe 30 is larger than the opening 50b on the side nearer to the transfer pipe 30. Then on the surface of the workpiece W, gas flow G1 reaching the side farther from the transfer pipe 30 can be increased as compared to gas flow G2 reaching the nearer side to perform uniform plasma processing.

In other words, this example allows for preventing the workpiece W from being irradiated with light emission L from plasma P, and at the same time allows for actively adjusting the distribution of gas flow relative to the workpiece W to enhance uniformity of plasma processing.

In this invention, the structure of the rectifier 50 provided for enhancing uniformity of plasma processing is not limited to that shown in FIG. 9. Various other structures can be used as long as the conductance for gas flow can be adjusted.

Figure 10:
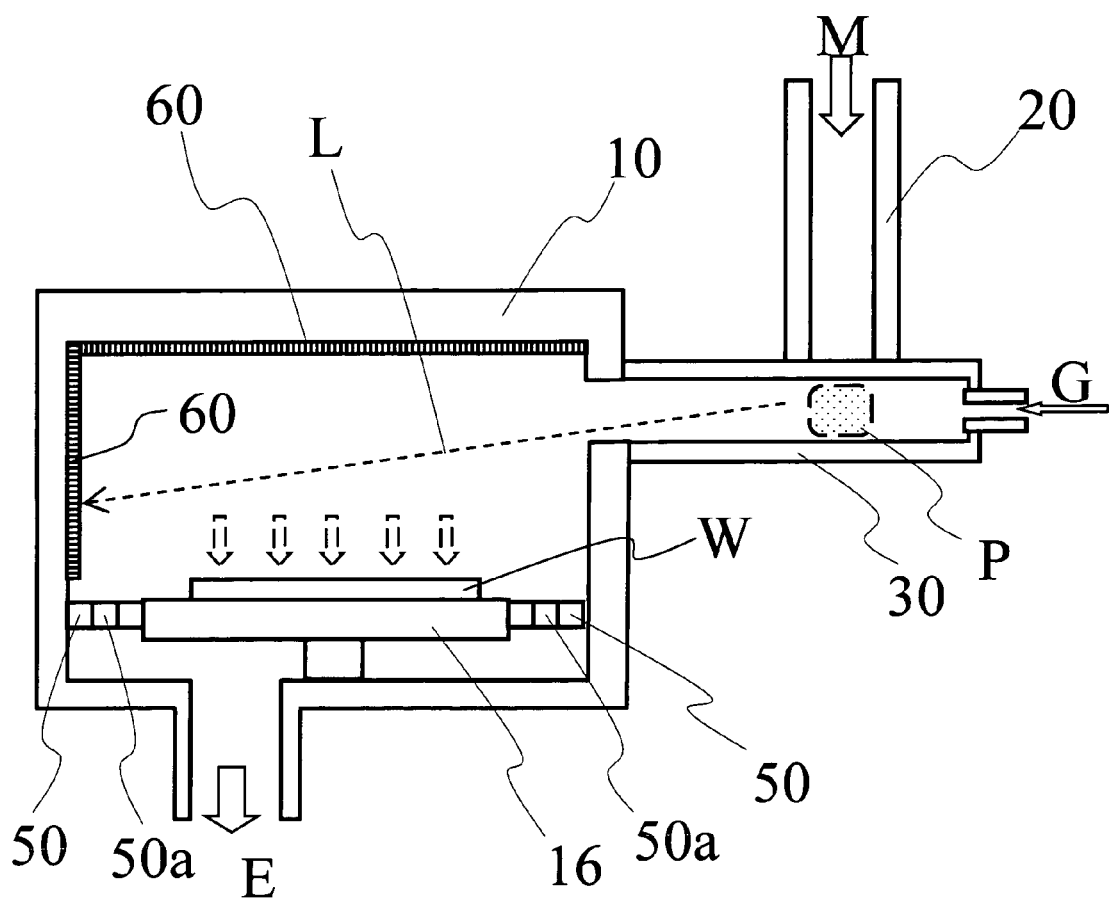
FIG. 10 is a schematic view showing a third example of the plasma processing device of the invention.

FIG. 10 is a schematic view showing a third example of the plasma processing device of the invention. Regarding this figure again, components similar to those described above with reference to FIGS. 1 to 9 are marked with like reference numerals and not described in detail.

In this example, an absorber 60 for absorbing light L from plasma P is provided on the inner wall of the chamber 10. Since light L from plasma P is absorbed by this absorber 60 on the inner wall of the chamber 10, the workpiece W is prevented from being irradiated therewith. This can more reliably suppress the effect of light L from plasma P.

The material and structure of the absorber 60 can be appropriately determined depending on the wavelength of the light L from plasma P. For example, when the light L from plasma P is ultraviolet radiation, various inorganic, metallic, and organic materials or composite materials thereof capable of absorbing this radiation can be used. Alternatively, it is also possible to use a wavelength selection filter or the like in which two kinds of thin films having different refractive indices are alternately laminated.

Figure 11:
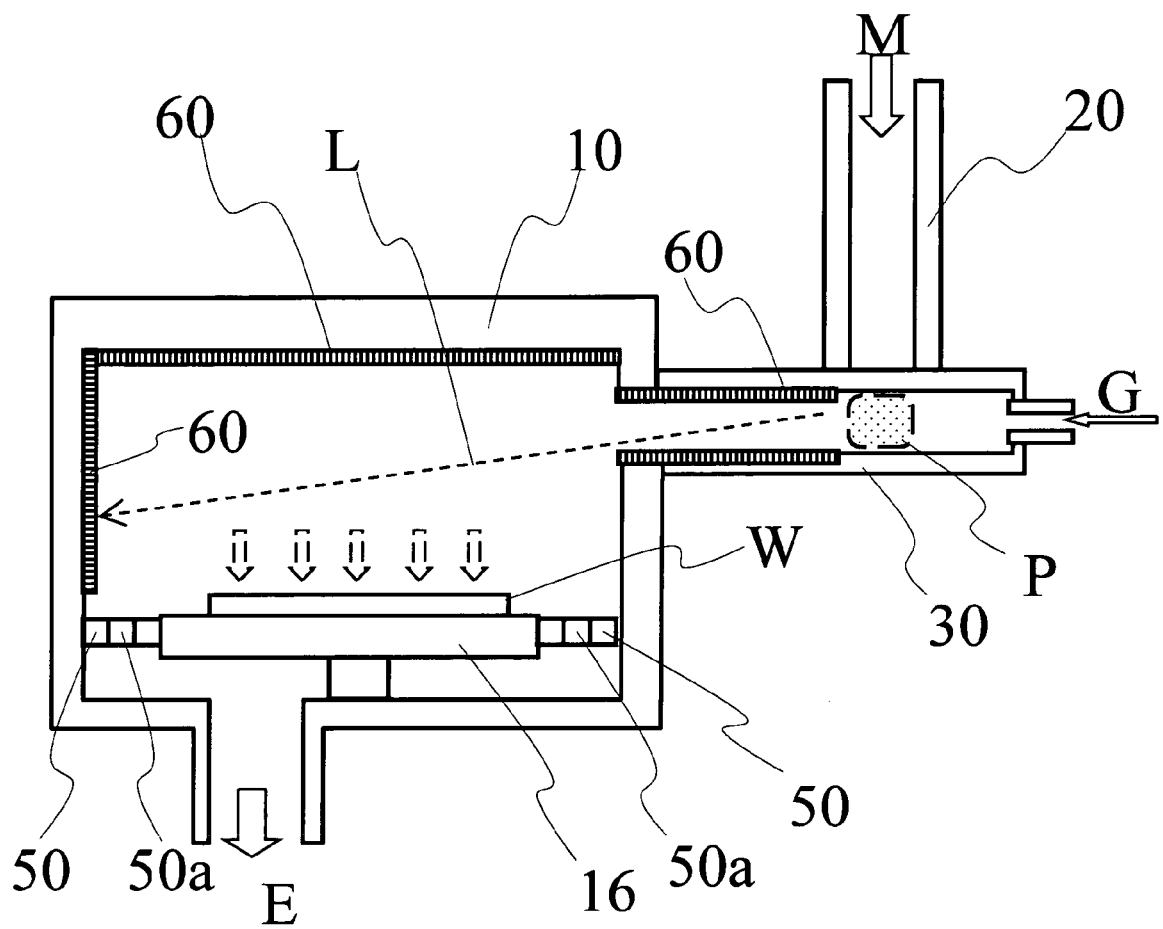
FIG. 11 is a schematic view showing an example in which an absorber is provided also on the inner wall of the transfer pipe 30.

As illustrated in FIG. 11, such an absorber 60 may be provided also on the inner wall of the transfer pipe 30. This can more reliably prevent reflection of light L at the inner wall of the transfer pipe 30, thereby blocking irradiation of the workpiece W with light L.

Figure 12:
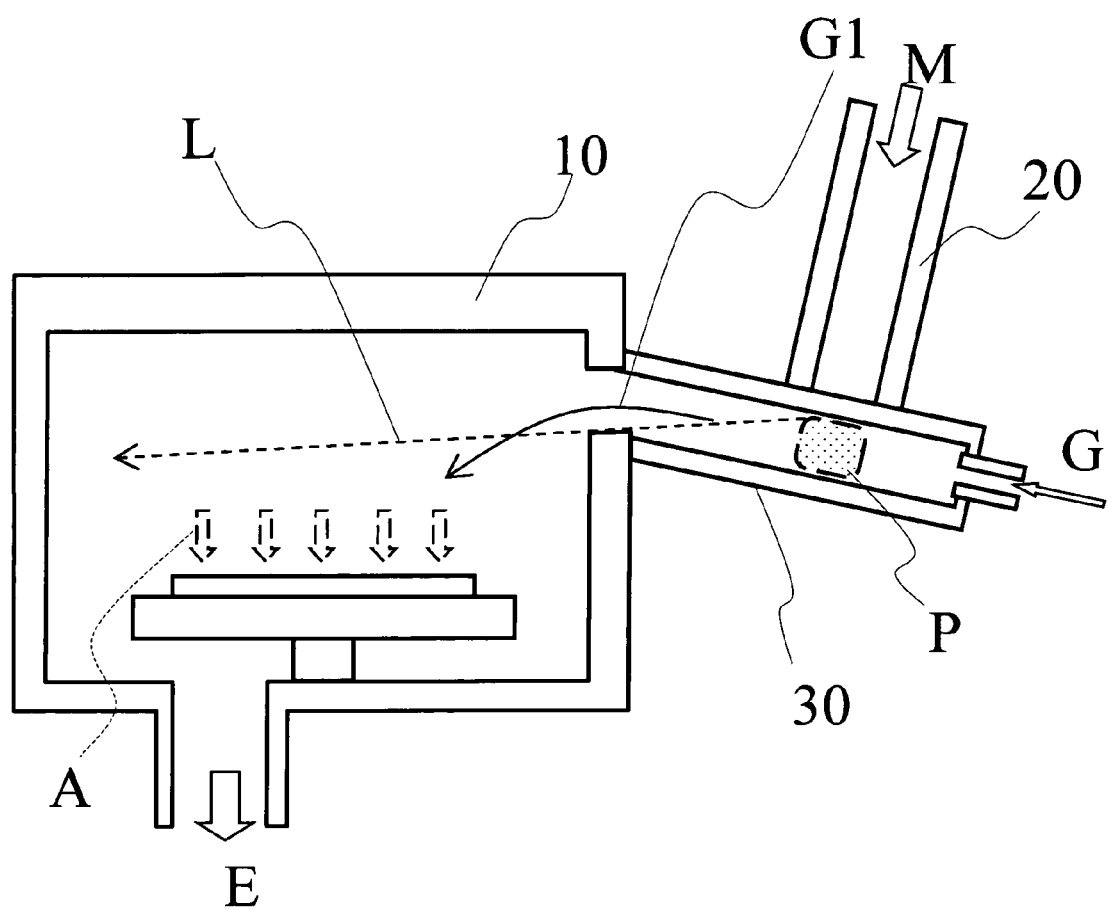
FIG. 12 is a schematic view showing a fifth example of the plasma processing device of the invention.

FIG. 12 is a schematic view showing a fifth example of the plasma processing device of the invention. Regarding this figure again, components similar to those described above with reference to FIGS. 1 to 11 are marked with like reference numerals and not described in detail.

In this example, the transfer pipe 30 is connected to the side face of the chamber 10 with a tilt. More specifically, the transfer pipe 30 is connected with a tilt such that its central axis is directed away from the workpiece W. In this way, light L from plasma P can be directed away from the workpiece W, and thereby irradiation of the workpiece W can be prevented more reliably.

Even if the transfer pipe 30 is connected to the chamber 10 with a tilt in this manner, active species such as radicals supplied from the plasma P are smoothly supplied to the workpiece W along the gas flow G1. That is, since the transfer pipe 30 has no "bend" or the like, active species are prevented from colliding with the pipe wall and being deactivated. As a result, plasma processing such as ashing can be performed rapidly and efficiently while avoiding the effect of light L.

Figure 13:
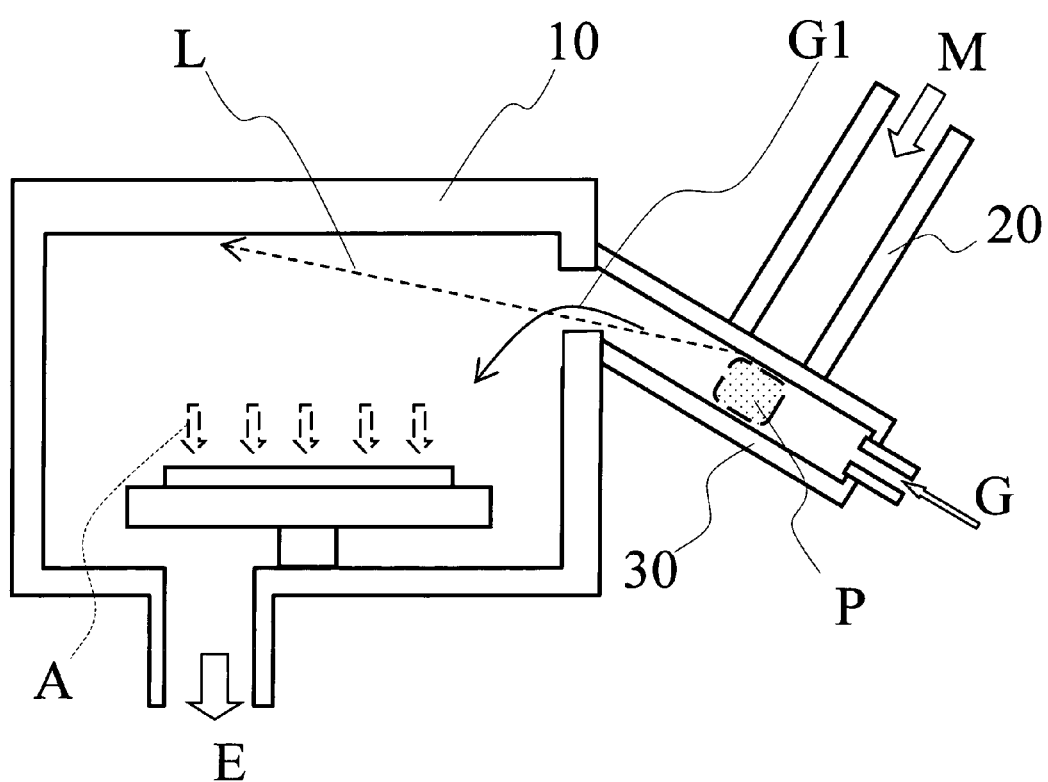
FIG. 13 is a schematic view showing an example in which the transfer pipe 30 has an increased tilt.

The effect of blocking light L of plasma P is increased as the tilt of the transfer pipe 30 is increased as illustrated in FIG. 13. That is, when the transfer pipe 30 is connected to the chamber 10 with a larger tilt as shown in FIG. 13, light L from plasma P can be directed farther away from the workpiece W. In this situation again, since the transfer pipe 30 has no "bend" or the like, active species such as radicals are supplied to the surface of the workpiece W along the gas flow G1 without being deactivated.

Figure 14:
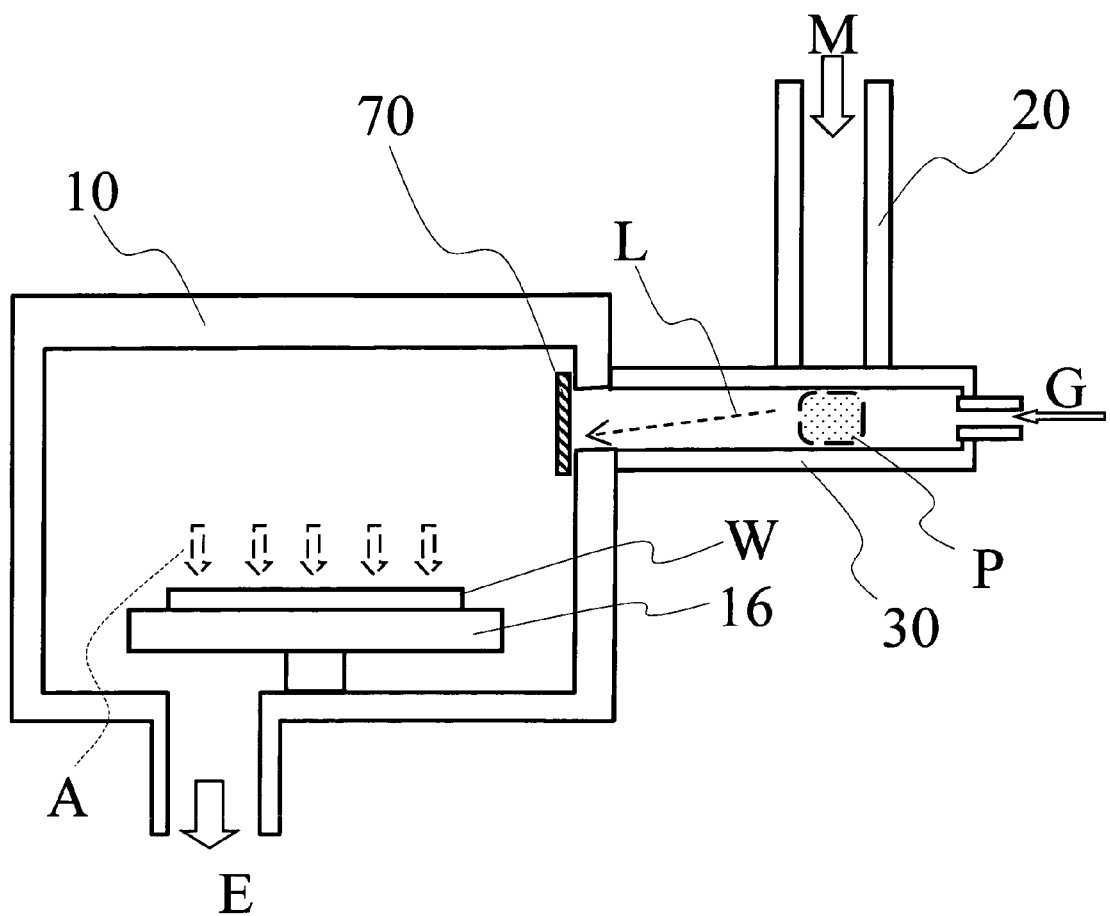
FIG. 14 is a schematic view showing a seventh example of the plasma processing device of the invention.

FIG. 14 is a schematic view showing a seventh example of the plasma processing device of the invention. Regarding this figure again, components similar to those described above with reference to FIGS. 1 to 13 are marked with like reference numerals and not described in detail.

In this example, a light shield 70 is provided near the opening end of the transfer pipe 30. The light shield 70 serves to block light L emitted from plasma P and to allow passage of active species such as radicals. This light shield 70 can avoid damage to the workpiece W caused by its irradiation with light L.

Figure 15:
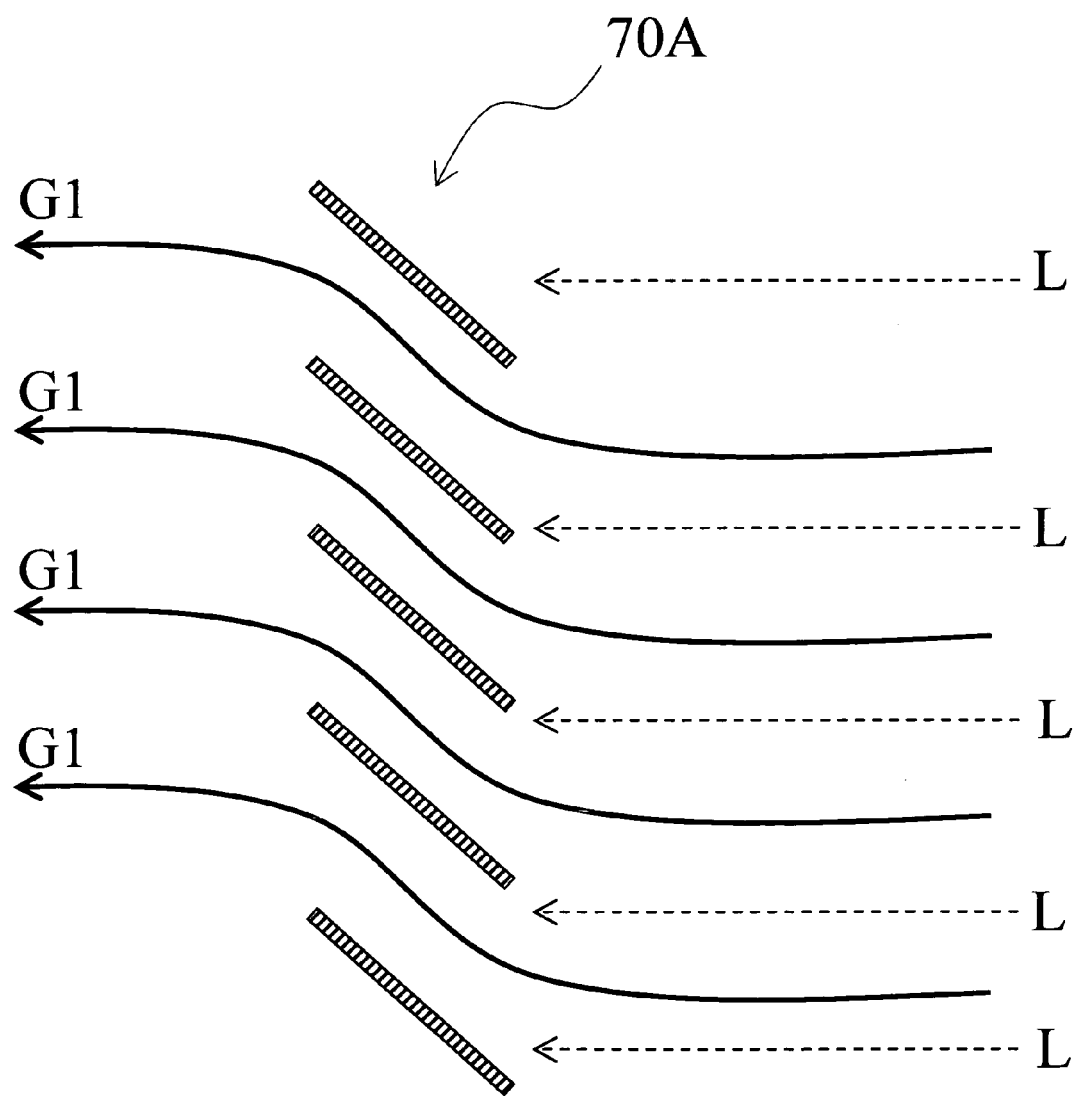
FIG. 15 is a schematic cross section showing an example of the light shield 70.

FIG. 15 is a schematic cross section showing an example of the light shield 70.

The light shield 70A of this example has a plurality of plate bodies arranged like a louver. Light L from plasma P is blocked by these plate bodies and does not reach the workpiece W. On the other hand, active species emitted from the plasma P flow through the gap of the plate bodies along the gas flow G1 and are supplied to the surface of the workpiece W.

It is contemplated here that part of the active species may collide with the plate bodies. Therefore the plate bodies are preferably made of material resistant to recombination of active species. For example, the rate of recombination of radicals is generally 0.1 to 0.2 for metals such as stainless steel, generally 0.001 to 0.01 for alumina and quartz, and generally 0.0001 for Teflon®. Therefore, among these, Teflon® can prevent deactivation of radicals most effectively.

Furthermore, to block light L more efficiently, the plate bodies constituting the light shield 70 or their surface are preferably formed from the absorber 60 described above with reference to FIGS. 10 and 11.

Figure 16:
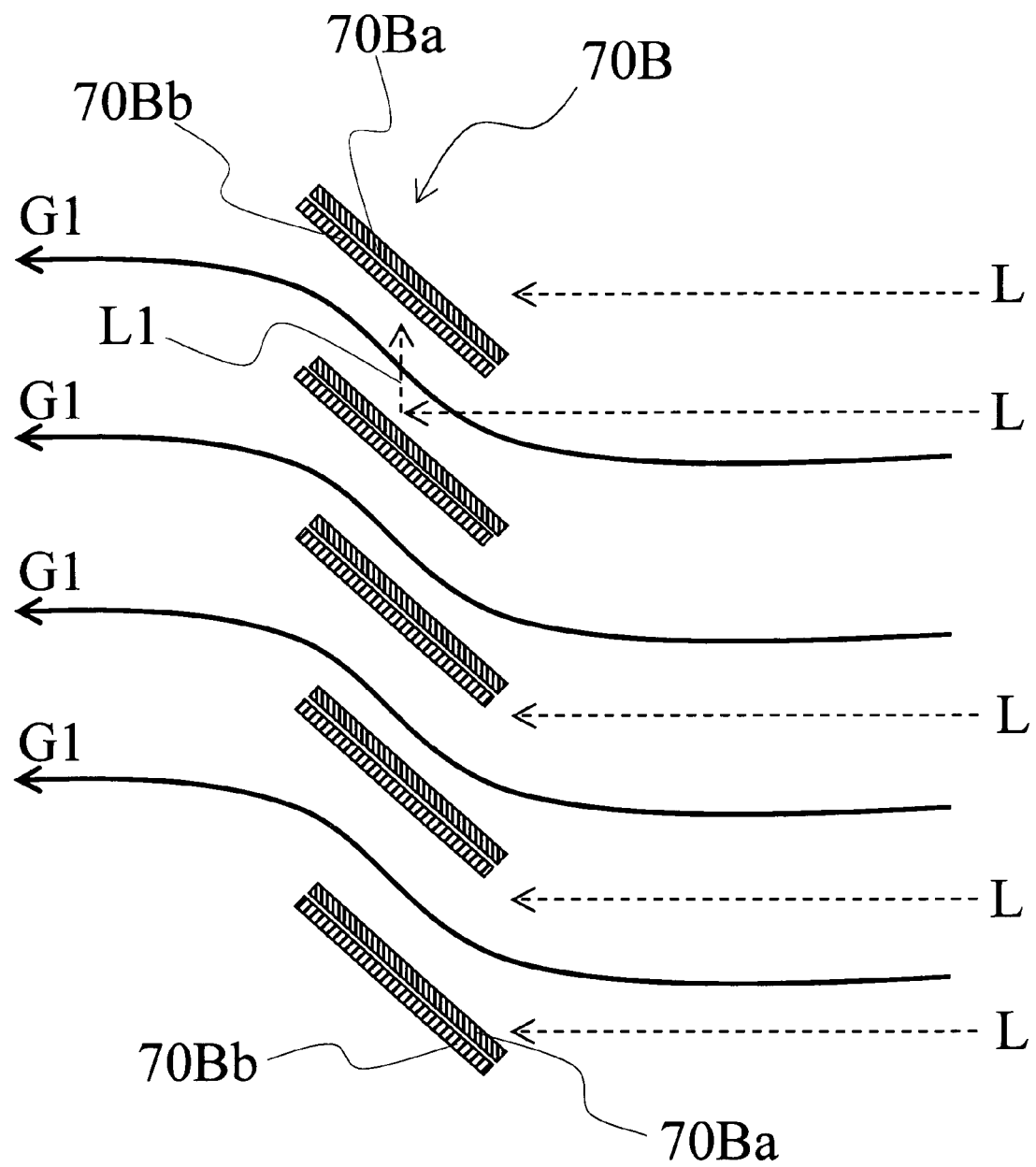
FIG. 16 is a schematic cross section showing an example in which the plate body is formed from a composite material.

FIG. 16 is a schematic cross section showing an example in which the plate body is formed from a composite material. More specifically, one face of the plate body constituting the light shield 70B of this example is formed from a first layer 70Ba, and the other face is formed from a second layer 70Bb. The first layer 70Ba is placed on the side of incidence of gas flow G1 and made of material that prevents deactivation of radicals. On the other hand, the second layer 70Bb is placed on the rear side and made of material that absorbs light L. In this way, light L reflected from the plate body as illustrated by arrow L1 can reliably be absorbed by the second layer 70Bb and blocked from the workpiece W. At the same time, this can also prevent deactivation of active species colliding with the surface 70Ba of the plate body along the gas flow G1.

Note that, contrary to this example, it is also possible to provide a layer for absorbing light L on the side of incidence of gas flow G1 and a layer for preventing deactivation of active species thereabove.

Figure 17:
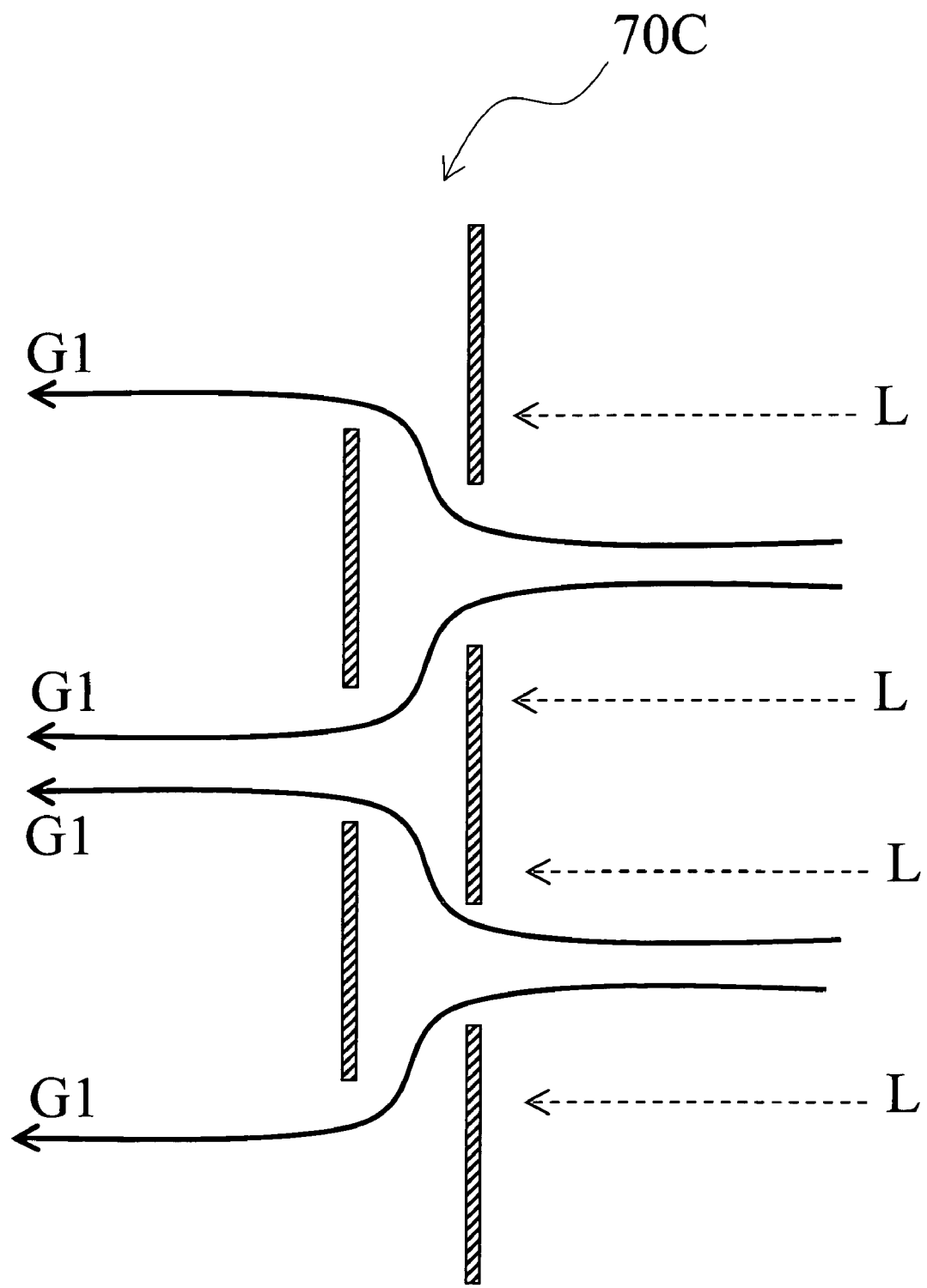
FIG. 17 is a schematic cross section showing an example of the light shield 70.

FIG. 17 is a schematic cross section showing an example of the light shield 70.

The light shield 70C of this example is a structure like a baffle having a plurality of baffle plates with openings. The openings of each baffle plate are formed so as not to overlap each other. With this light shield 70C as well, light L from plasma P is blocked by these baffle plates and does not reach the workpiece W. On the other hand, active species emitted from the plasma P flow through the openings along the gas flow G1 and are supplied to the surface of the workpiece W.

It is possible also in this example to form one face of the baffle plate from a layer for preventing deactivation of radicals and the other face from a layer for absorbing light L as illustrated in FIG. 16. This also allows for absorbing light L more reliably while preventing deactivation of radicals at the same time.

Figure 18:
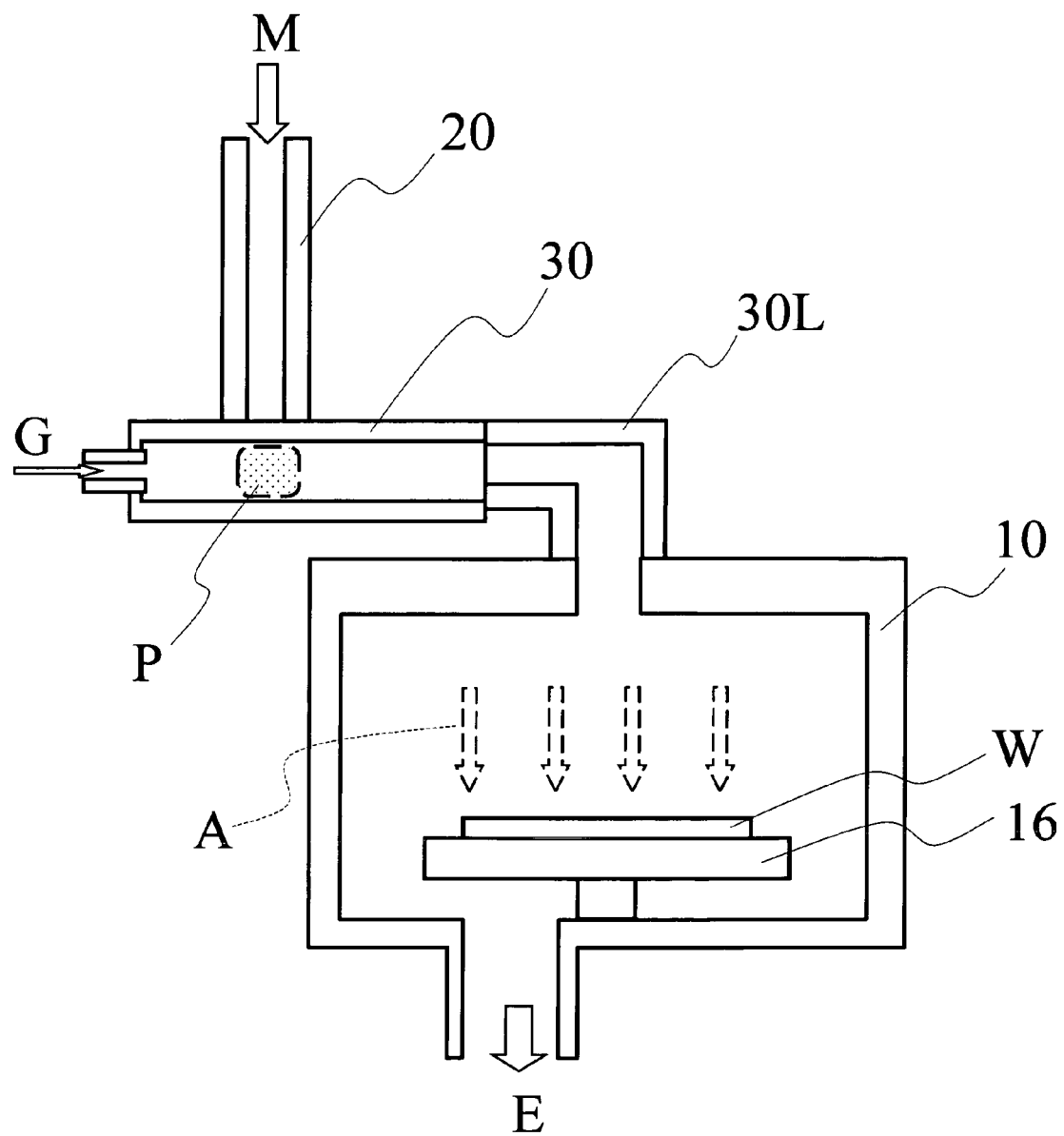
FIG. 18 is a schematic view showing an eighth example of the plasma processing device of the invention.

FIG. 18 is a schematic view showing an eighth example of the plasma processing device of the invention. Regarding this figure again, components similar to those described above with reference to FIGS. 1 to 17 are marked with like reference numerals and not described in detail.

In this example, the transfer pipe 30 is connected to the upper face of the chamber 10 via a connection pipe 30L inflected in a generally L shape. Active species emitted from plasma P are supplied directly above the workpiece W via these transfer pipe 30 and connection pipe 30L. The connection pipe 30L inflected generally at right angles allows for blocking light L emitted from the plasma P and protecting the workpiece W. However, in this structure, a high proportion of active species collide with the pipe wall of the generally L-shaped connection pipe 30L, which results in a heavy loss due to deactivation. For this reason, the connection pipe 30L is formed from material resistant to recombination of active species. Specifically, the connection pipe 30L is formed from a fluorine-containing resin such as Teflon®. This also allows for blocking light L while preventing deactivation of active species at the same time.

It is possible also in this example to provide a rectifier 50 as described above with reference to FIG. 9, to provide an absorber 60 for light L as described above with reference to FIGS. 10 and 11, and to provide a light shield 70 as described above with reference to FIGS. 14 to 17.

Figure 19:
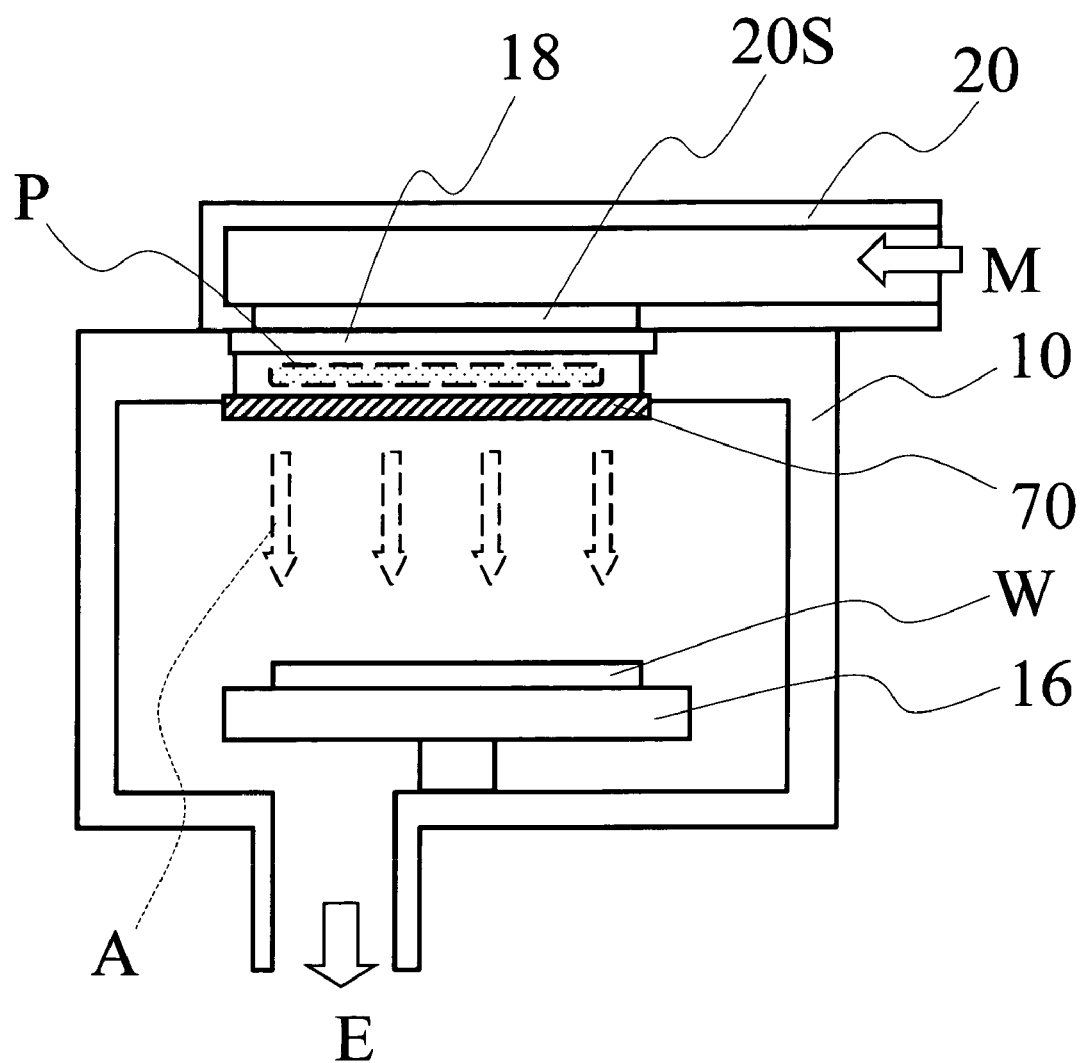
FIG. 19 is a schematic view showing a ninth example of the plasma processing device of the invention.
Figure 20:
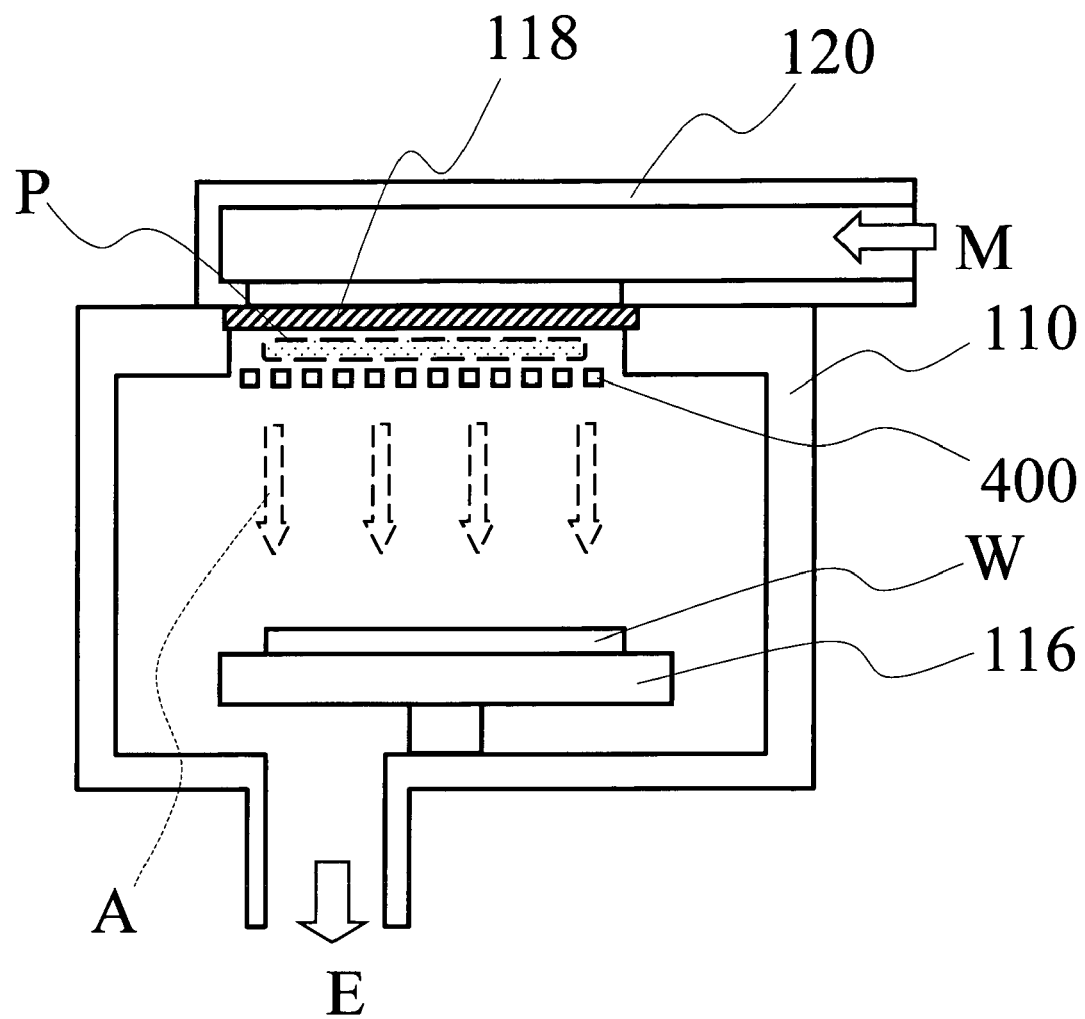
FIG. 20 is a schematic view showing an example "down flow type" ashing device.

FIG. 19 is a schematic view showing a ninth example of the plasma processing device of the invention. Regarding this figure again, components similar to those described above with reference to FIGS. 1 to 18 are marked with like reference numerals and not described in detail.

This example is a "down flow type" plasma processing device. This device has a chamber 10, a transmission window 18 made of a planar dielectric plate provided on the upper face of the chamber 10, a microwave waveguide 20 provided outside the transmission window 18, and a stage 16 for mounting and holding a workpiece W such as a semiconductor wafer in the processing space below the transmission window 18.

The chamber 10 can maintain a depressurized atmosphere formed by an evacuation system E. A gas introduction pipe (not shown) for introducing a processing gas into the processing space is provided as appropriate.

For example, this plasma processing device may be used to etch the surface of a workpiece W as follows. First, the workpiece W is mounted on the stage 16 with its surface turned upward. Next, the processing space is depressurized by the evacuation system E, and an etching gas serving as a processing gas is then introduced into the processing space. Subsequently, an atmosphere of the processing gas is formed in the processing space, where a microwave M is fed from the microwave waveguide 20 to a slot antenna 20S.

The microwave M is emitted from the slot antenna 20S toward the transmission window 18. The transmission window 18 is made of dielectric such as quartz or alumina. The microwave M propagates on the surface of the transmission window 18 and is emitted into the processing space inside the chamber 10. Energy of the microwave M emitted into the processing space in this manner forms a plasma of the processing gas. When the electron density in the plasma thus generated exceeds a density (cutoff density) at which the microwave M supplied through the transmission window 18 can be blocked, the microwave is reflected within a certain distance (skin depth) d extending from the lower face of the transmission window 18 into the processing space in the chamber. A standing wave of the microwave is thus formed between this reflecting surface of microwave and the lower face of the slot antenna 20S.

The reflecting surface of microwave then serves as a plasma excitation surface, where a stable plasma P is excited. In the stable plasma P excited at this plasma excitation surface, ions and electrons collide with molecules of the processing gas to generate excited active species (plasma products) such as excited atoms, molecules, and free atoms (radicals). These plasma products diffuse in the processing space as represented by arrow A and fly to the surface of the workpiece W, where plasma processing such as etching occurs.

Furthermore, in this example, a light shield 70 is provided between the plasma P and the workpiece W. The light shield 70 is shaped as a louver or baffle, for example, as described above with reference to FIGS. 14 to 17, and allows passage of active species such as radicals while blocking light L emitted from the plasma P. This light shield 70 can avoid damage to the workpiece W caused by light L from plasma P and perform plasma processing with high efficiency also in the down flow type plasma processing device.

It is possible also in this example to provide a rectifier 50 as described above with reference to FIG. 9 and to provide an absorber 60 for light L as described above with reference to FIGS. 10 and 11.

Embodiments of the invention have been described with reference to examples. However, the invention is not limited to these examples.

For example, the kind of low-k materials and resists used in the ashing method of the invention, the elements constituting the plasma processing device and their arrangement, and the like may be appropriately adapted by those skilled in the art based on the spirit of the invention, and they are also encompassed within the scope of the invention.

INDUSTRIAL APPLICABILITY

According to the invention, rapid and efficient plasma processing can be performed while avoiding damage to a workpiece caused by light emitted from plasma. As a result, for example, multilayer interconnect structures and insulated gate devices using low-k materials can be stably manufactured, thus providing significant industrial advantages.

The invention claimed is:

1. A plasma processing device, comprising:
a chamber provided to maintain an atmosphere depressurized to less than atmospheric pressure;
a transfer pipe connected to the chamber;
a gas introduction mechanism provided to introduce a gas into the transfer pipe;
a microwave supply source provided to introduce a microwave from outside to inside of the transfer pipe; and
a light shield configured to block light emitted from the plasma and to allow passage of active species emitted from the plasma, the light shield being provided substantially in contact with an inner wall of the chamber at a part where the active species are introduced into the chamber, wherein
the plasma processing device is provided to form a plasma of the gas in the transfer pipe and to perform ashing processing to remove a resist of a workpiece having a low-k material on which the resist is formed placed in the chamber,
the transfer pipe is connected to an opening in the inner wall of the chamber, the inner wall being generally perpendicular to a major surface of the workpiece, and
the workpiece is not provided in a direct line of sight from the plasma.

2. A plasma processing device according to claim 1, wherein the transfer pipe is connected to the inner wall of the chamber with a tilt such that an axis line of the transfer pipe is directed away from the workpiece as compared to when the transfer pipe is connected generally perpendicular to the inner wall of the chamber.

3. A plasma processing device, comprising:
a chamber provided to maintain an atmosphere depressurized to less than atmospheric pressure;
a transfer pipe connected to the chamber via a generally L-shaped connection pipe;

a gas introduction mechanism provided to introduce a gas into the transfer pipe;

a microwave supply source provided to introduce a microwave from outside to inside of the transfer pipe; and a light shield configured to block light emitted from the plasma and to allow passage of active species emitted from the plasma, the light shield being provided substantially in contact with an inner wall of the chamber at a part where the active species are introduced into the chamber, wherein the plasma processing device is provided to form a plasma of the gas in the transfer pipe and to perform ashing processing to remove a resist of a workpiece having a low-k material on which the resist is formed placed in the chamber, the connection pipe is connected to an opening in the inner wall of the chamber, the inner wall being generally opposed to a major surface of the workpiece, and the connection pipe has an inner wall made of a fluorine-containing resin.

4. A plasma processing device, comprising:

a chamber provided to maintain an atmosphere depressurized to less than atmospheric pressure;

a transmission window provided to occupy part of a wall of the chamber;

a microwave supply source provided to introduce a microwave from outside to inside of the chamber via the transmission window; and a gas introduction mechanism provided to introduce a gas into the chamber, wherein the plasma processing device provided to form a plasma of the gas in the chamber and to perform plasma processing on a workpiece placed in the chamber, and a light shield configured to block light emitted from the plasma and to allow passage of active species emitted from the plasma is provided substantially in contact with an inner wall of the chamber at a part where the active species are introduced into the chamber.

5. A plasma processing device according to claims 1, 2, 3, or 4, further comprising rectifying means for regulating distribution of gas flow on the workpiece, the gas flow being supplied from the transfer pipe.

6. A plasma processing device according to claims l, 2, 3, or 4, wherein an absorber to absorb light emitted from the plasma is provided on at least one of the inner wall of the chamber and an inner wall of the transfer pipe.

7. An ashing method for removing a resist of a workpiece having an insulating layer on which the resist is formed, comprising:

forming a plasma containing hydrogen and an inert gas;

allowing active species emitted from the plasma to act on the workpiece placed in a chamber that is provided to maintain an atmosphere depressurized to less than atmospheric pressure; and removing the resist in a condition that light emitted from the plasma is blocked by a light shield which is substantially in contact with an inner wall of the chamber at a part where the active species are introduced into the chamber.

8. An ashing method according to claim 7, wherein the inert gas is helium.

9. An ashing method according to claim 7 or 8, wherein the insulating layer comprises a low-k material.

* * * * *